United States Patent
Ross et al.

(10) Patent No.: US 10,348,302 B1
(45) Date of Patent: Jul. 9, 2019

(54) RADIATION-HARDENED LATCH CIRCUIT

(71) Applicant: BAE SYSTEMS INFORMATION AND ELECTRONIC SYSTEMS INTEGRATION INC., Nashua, NH (US)

(72) Inventors: Jason F. Ross, Haymarket, VA (US); Jamie A. Bernard, Midland, VA (US); John T. Matta, Nokesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/994,671

(22) Filed: May 31, 2018

(51) Int. Cl.
| | | |
|---|---|---|
| H03K 19/003 | (2006.01) | |
| H03K 19/007 | (2006.01) | |
| H01L 23/556 | (2006.01) | |
| H03K 19/20 | (2006.01) | |

(52) U.S. Cl.
CPC ....... *H03K 19/0033* (2013.01); *H01L 23/556* (2013.01); *H03K 19/007* (2013.01); *H03K 19/20* (2013.01)

(58) Field of Classification Search
CPC .. H03K 19/0033; H03K 19/007; H03K 19/20; H01L 23/556

USPC .......................................... 326/15
See application file for complete search history.

(56) References Cited

U.S. PATENT DOCUMENTS

| | | | |
|---|---|---|---|
| 2009/0045834 A1* | 2/2009 | Farwell .............. | H03K 19/0033 326/21 |
| 2010/0148837 A1* | 6/2010 | McAdams .......... | H03K 3/0375 327/225 |
| 2015/0214933 A1* | 7/2015 | Sehgal ................. | H03K 3/013 326/94 |

* cited by examiner

*Primary Examiner* — Daniel D Chang
(74) *Attorney, Agent, or Firm* — Antony P. Ng; Russell Ng PLLC; Scott J. Asmus

(57) ABSTRACT

A radiation-hardened electronic system is disclosed. The radiation-hardened electronic system includes a reconfigurable analog circuit block, a digital configuration logic circuit block, and a radiation-hardened isolation latch circuit connecting between the reconfigurable analog circuit block and the digital configuration logic circuit block. The reconfigurable analog circuit block includes multiple analog inputs and outputs. The digital configuration logic circuit block includes multiple digital inputs and outputs for controlling various functionalities of the reconfigurable analog circuit block via a set of configuration data. The radiation-hardened isolation latch circuit prevents the configuration data from entering the reconfigurable analog circuit block when the configuration data has been corrupted by a SEU.

5 Claims, 3 Drawing Sheets

US 10,348,302 B1

RADIATION-HARDENED LATCH CIRCUIT

TECHNICAL FIELD

The present invention relates to electronic circuits in general, and in particular to a radiation-hardened latch circuit for isolating a set of digital circuits from a set of analog circuits.

BACKGROUND

Generally speaking, a single event upset (SEU) is a change of state caused by alpha particles, neutrons, ions or electromagnetic radiation in an integrated circuit within an electronic device. The integrated circuit may be a field-programmable gate array (FPGA) or an application-specific integrated circuit (ASIC), and the electronic device may be part of a larger system having multiple electronic devices. A SEU may lead to an error, a malfunction, and/or a failure of the integrated circuit, the electronic device and/or the entire system.

The error caused by a SEU may be a correctable error (i.e., a soft error) or a non-correctable error (i.e., a fatal error). For an electronic device, the SEU rate may be proportional to the amount of memory devices within the electronic device. For an FPGA, the SEU rate may be proportional to the amount of configuration memory within the FPGA. Even with a large amount of memory, a small percentage of SEUs may cause malfunction of an electronic device. Thus, when there is a large number of electronic devices, either as stand-alone units or as part of a system, even a small amount of SEUs may create reliability issues for users of the electronic devices or systems.

In certain environments, such as satellite orbital space, in which the level of radiation is relatively intense, integrated circuits are more susceptible to SEUs and/or soft errors. Consequently, it would be desirable to provide a radiation-hardened electronic system to be employed in space environments.

SUMMARY

In accordance with one embodiment of the present disclosure, a radiation-hardened electronic system includes a reconfigurable analog circuit block, a digital configuration logic circuit block, and a radiation-hardened isolation latch circuit connecting between the reconfigurable analog circuit block and the digital configuration logic circuit block. The reconfigurable analog circuit block includes multiple analog inputs and outputs. The digital configuration logic circuit block includes multiple digital inputs and outputs for controlling various functionalities of the reconfigurable analog circuit block via a set of configuration data. The radiation-hardened isolation latch circuit prevents the configuration data from entering the reconfigurable analog circuit block when the configuration data has been corrupted by a SEU.

The features and advantages described herein are not all-inclusive and, in particular, many additional features and advantages will be apparent to one of ordinary skill in the art in view of the drawings, specification and claims. Moreover, it should be noted that the language used in the specification has been selected principally for readability and instructional purposes and not to limit the scope of the inventive subject matter.

BRIEF DESCRIPTION OF THE DRAWINGS

The invention itself, as well as its modes of use, further objects, and advantages thereof, will best be understood by reference to the following detailed description of an illustrative embodiment when read in conjunction with the accompanying drawings, wherein.

DETAILED DESCRIPTION

Figure 1:
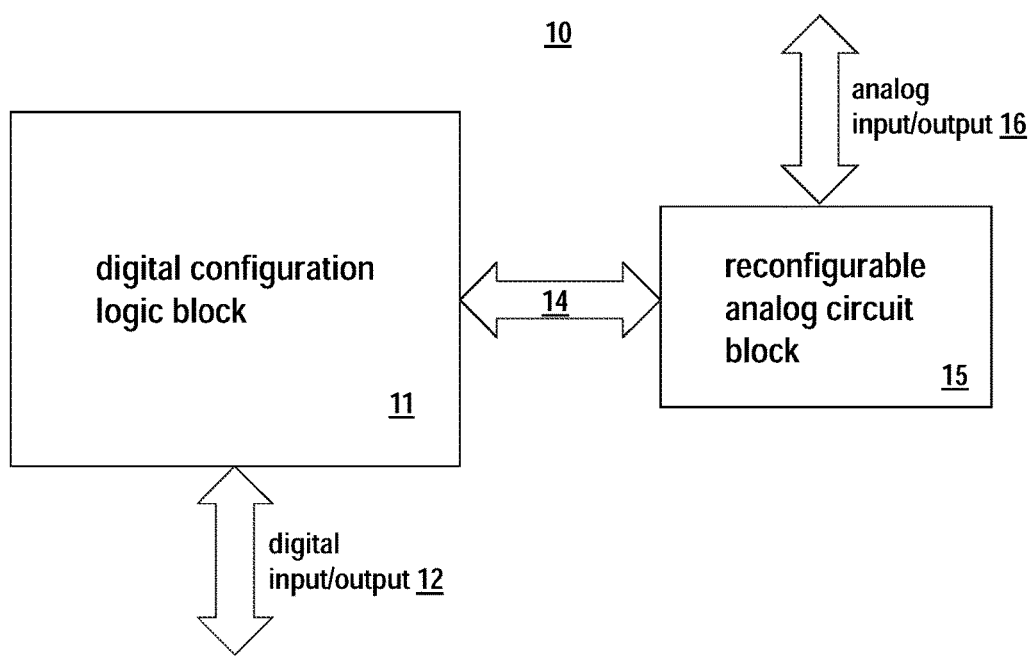
FIG. 1 is a block diagram of an electronic system having a group of analog circuits coupled to a group of digital circuits, according to the prior art.

Referring now to the drawings and in particular to FIG. 1, there is illustrated a block diagram of an electronic system having an analog circuit block coupled to a digital circuit block, according to the prior art. As shown, an electronic system 10 includes a digital configuration logic circuit block 11 coupled to a reconfigurable analog circuit block 15 via a configuration input/output interface 14. Digital configuration logic circuit block 11 includes a digital input/output 12. Similarly, reconfigurable analog circuit block 15 includes an analog input/output 16. Configuration input/output interface 14 provides communications between digital configuration logic circuit block 11 and reconfigurable analog circuit block 15.

Reconfigurable analog circuit block 15 can be configured to perform specific analog input/output functions. This is accomplished by using digital configuration logic block 11 and configuration input/output interface 14 based on digital inputs entered via digital input/output 12. However, digital configuration logic block 11 and configuration input/output interface 14 are prone to single event upsets (SEUs), which may lead to errors, malfunctions, and/or failures to electronic system 10.

Figure 2:
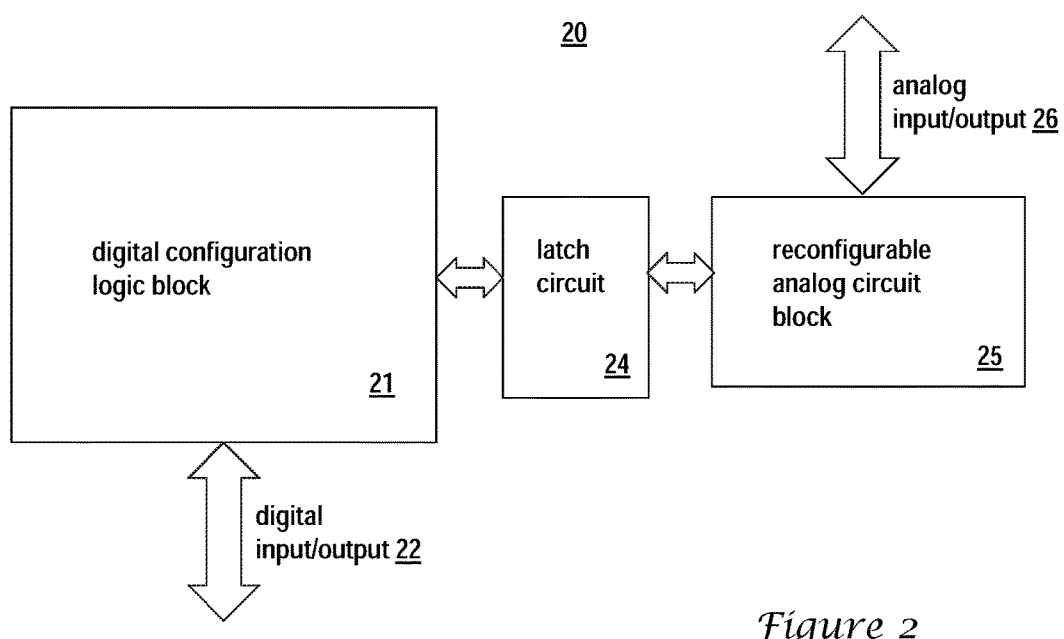
FIG. 2 is a block diagram of an electronic system having a group of analog circuits coupled to a group of digital circuits, according to one embodiment.

With reference now to FIG. 2, there is illustrated a block diagram of an electronic system having an analog circuit block coupled to a digital circuit block, according to one embodiment. As shown, an electronic system 20 includes a digital configuration logic circuit block 21 coupled to a reconfigurable analog circuit block 25 via a radiation-hardened isolation latch circuit 24. Digital configuration logic circuit block 21 can be, for example, a Joint Test Action Group (JTAG) device, a field-programmable gate array (FPGA) and/or an application-specific integrated circuit (ASIC). Digital configuration logic circuit block 21 includes a digital input/output 22, and reconfigurable analog circuit block 25 includes an analog input/output 26. Radiation-hardened isolation latch circuit 24 provides communications between digital configuration logic circuit block 21 and reconfigurable analog circuit block 25. Reconfigurable analog circuit block 25 can be configured to perform specific analog input/output functions by using digital configuration logic block 21 and radiation-hardened isolation latch circuit 24 based on digital inputs entered via digital input/output 22.

Radiation-hardened isolation latch circuit 24 provides the necessary SEU protection for digital configuration logic block 21 as well as electronic system 20 by ensuring erroneous configuration data caused by SEUs will not be passed from configuration logic block 21 to reconfigurable analog circuit block 25. In other words, when erroneous configuration data are produced by digital configuration logic block 21 as a result of digital configuration logic block 21 having been struck by alpha particles, neutrons, ions or electromagnetic radiation, radiation-hardened isolation latch circuit 24 will ensure that those erroneous configuration data will not be sent to reconfigurable analog circuit block 25 to cause reconfigurable analog circuit block 25 to produce an unknown result or even malfunction. In addition, the data within radiation-hardened isolation latch circuit 24 itself are also protected from the influences of SEUs.

Figure 3:
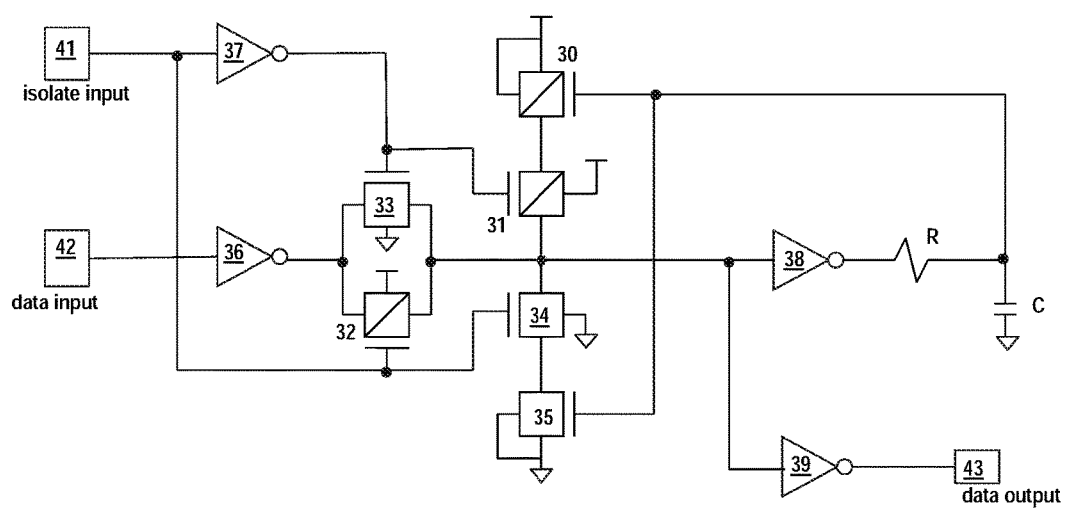
FIG. 3 is a circuit diagram of a radiation-hardened isolation latch circuit within the electronic system from FIG. 2, according to one embodiment.

Referring now to FIG. 3, there is illustrated a circuit diagram of radiation-hardened isolation latch circuit 24, according to one embodiment. As shown, radiation hardened isolation latch 24 includes p-channel devices 30-32, n-channel devices 33-35, and inverters 36-39. P-channel devices 30-31 and n-channel devices 34-35 are connected in series between Vdd and Vss. The bodies of p-channel devices 30-31 are connected to Vdd. The bodies of n-channel devices 34-35 are connected to Vss. P-channel device 32 and n-channel device 33 are connected in parallel to form a transmission gate. P-channel device 30 and n-channel device 35 together form a feedback inverter for radiation-hardened isolation latch circuit 24.

An isolate input 41 of radiation-hardened isolation latch circuit 24 is connected to the gate of p-channel device 31 and the gate of n-channel device 33 via inverter 37. Isolate input 41 is also directly connected to the gate of p-channel device 32 and the gate of n-channel device 34.

A data input 42 of radiation-hardened isolation latch circuit 24 is connected to the transmission gate formed by p-channel device 32 and n-channel device 33 via inverter 36. The output of the transmission gate formed by p-channel device 32 and n-channel device 33 is directly connected to the node between p-channel device 31 and n-channel device 34 as well as to the input of inverter 38 and the input of inverter 39.

The output of inverter 38 is connected to the gate of p-channel device 30 and the gate of n-channel device 35 via a resistor R. Resistor R is also connected to ground via a capacitor C. The output of inverter 39 provides a data output 43 for radiation-hardened isolation latch circuit 24.

In order to initiate a Data Write cycle for radiation-hardened isolation latch circuit 24 (i.e., to pass data from data input 42 into radiation-hardened isolation latch circuit 24), isolate input 41 is set to a logical 0, which turns on the transmission gate formed by p-channel device 32 and n-channel device 33, and turns off p-channel device 31 and n-channel device 34. At this point, data at data input 42 can be sent into radiation-hardened isolation latch 24 via inverter 36, the transmission gate formed by p-channel device 32 and n-channel device 33, and inverter 39, and appears up at data output 43. At the same time, data at data input 42 will also be sent to the feedback inverter formed by p-channel device 30 and n-channel device 35 via inverter 38.

In order to initiate a Data Hold cycle for radiation-hardened isolation latch circuit 24 (i.e., to block data at data input 42 from entering into radiation-hardened isolation latch circuit 24), isolate input 41 is set to a logical 1, which turns off p-channel device 32 and n-channel device 33, and turns on p-channel device 31 and n-channel device 34. At this point, data at data input 42 will not be sent into radiation-hardened isolation latch 24 because the transmission gate formed by p-channel device 32 and n-channel device 33 is turned off. At the same time, data being held within feedback inverter formed by p-channel device 30 and n-channel device 35 will be sent to data output 43 via inverter 39.

Resistor R and capacitor C provide the necessary SEU hardening for radiation-hardened isolation latch circuit 24 by setting the RC time constant of resistor R and capacitor C to be longer than the duration of a SEU. The resistance of resistor R can be, for example, 50 k$\Omega$, and the capacitance of capacitor C can be, for example, 0.05 pF. Since the RC time constant of resistor R and capacitor C is longer than the duration of a SEU, radiation-hardened isolation latch circuit 24 will not be affected by SEUs.

As has been described, the present disclosure provides a radiation-hardened isolation latch circuit for isolating a digital circuit block from an analog circuit block.

While the invention has been particularly shown and described with reference to a preferred embodiment, it will be understood by those skilled in the art that various changes in form and detail may be made therein without departing from the spirit and scope of the invention.

What is claimed is:

1. An electronic system comprising:
    a reconfigurable analog circuit block having a plurality of analog inputs and outputs;
    a digital configuration logic circuit block having a plurality of digital inputs and outputs for controlling various functionalities of said reconfigurable analog circuit block via a set of configuration data; and
    a radiation-hardened isolation latch circuit connecting between said reconfigurable analog circuit block and said digital configuration logic circuit block for preventing said set of configuration data from entering said reconfigurable analog circuit block when said set of configuration data have been corrupted by a single event upset (SEU), wherein said radiation-hardened isolation latch circuit includes a data input and an isolate input for controlling data at said data input entering into said radiation-hardened isolation latch circuit, wherein said data input is coupled to a transmission gate and a feedback inverter, wherein said feedback inverter is coupled to a data output and said feedback inverter is connected to a resistor and a capacitor in a feedback path.

2. The electronic system of claim 1, wherein said resistor and said capacitor have a time constant longer than said SEU.

3. The electronic system of claim 1, wherein said digital configuration logic circuit block is a Joint Test Action Group device.

4. The electronic system of claim 1, wherein said digital configuration logic circuit block is a field-programmable gate array.

5. The electronic system of claim 1, wherein said digital configuration logic circuit is an application-specific integrated circuit.

* * * * *